(12) United States Patent
Xu et al.

(10) Patent No.: US 12,339,181 B2
(45) Date of Patent: Jun. 24, 2025

(54) MINIATURE GRAPHENE AEROGEL DEVICE AND PREPARATION METHOD THEREOF

(71) Applicant: ZHEJIANG UNIVERSITY, Hangzhou (CN)

(72) Inventors: Zhen Xu, Hangzhou (CN); Kai Pang, Hangzhou (CN); Chao Gao, Hangzhou (CN); Xiaoting Liu, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 540 days.

(21) Appl. No.: 17/583,123

(22) Filed: Jan. 24, 2022

(65) Prior Publication Data
US 2022/0146339 A1    May 12, 2022

Related U.S. Application Data

(63) Continuation of application No. PCT/CN2020/078909, filed on Mar. 12, 2020.

(51) Int. Cl.
*G01L 1/18* (2006.01)
*C01B 32/198* (2017.01)
(Continued)

(52) U.S. Cl.
CPC ............ *G01L 1/183* (2013.01); *C01B 32/198* (2017.08); *G01L 1/162* (2013.01); *H10N 30/85* (2023.02); *H10N 30/084* (2023.02)

(58) Field of Classification Search
CPC ... C01B 32/182; C01B 32/184; C01B 32/186; C01B 32/188; C01B 32/19; C01B 32/192; C01B 32/194; C01B 32/196; C01B 32/198; C01B 2204/00; C01B 2204/02; C01B 2204/04; C01B 2204/06; C01B 2204/065; C01B 2204/20; C01B 2204/22;
(Continued)

(56) References Cited

U.S. PATENT DOCUMENTS

2013/0133925 A1* 5/2013 Kim .................. H01B 1/24
174/126.4

FOREIGN PATENT DOCUMENTS

| CN | 106698407 A | 5/2017 |
| CN | 209256945 U | 8/2019 |
| CN | 110697692 A | 1/2020 |

OTHER PUBLICATIONS

Stankovich, et al., Synthesis of graphene-based nanosheets via chemical reduction of exfoliated graphite oxide, Carbon 2007; 1558-1565 (Year: 2007).*
Niemeier, et al., Hydrazine and Aqueous Hydrazine Solutions: Evaluating Safety in Chemical Processes, Org. Process. Res. Dev. 2013; 17: 1580-1590 (Year: 2013).*
The Basics of Polyimide | An Explanation of how it is Used, accessed online at https://www.electronics.toray/en/column/polyimide_01.html (Year: 2024).*
(Continued)

*Primary Examiner* — Daniel C. McCracken (57) ABSTRACT

Disclosed are a preparation method for a graphene aerogel array sensor and use thereof. A miniature graphene aerogel array device is prepared by combining in-situ printing and solvent plasticization and foaming, which has excellent flexibility and stability, and is suitable for use in a variety of scenarios, such as sensors, and energy storage devices, etc. The array sensor provided in the present disclosure exhibits extremely high stability, high accuracy and reliability. Combining with deep machine learning, the array sensor can be endowed with the function of learning and recognition of machine intelligence, thus greatly promoting the development of the next generation of artificial intelligence.

5 Claims, 10 Drawing Sheets

(51) Int. Cl.
  *G01L 1/16*    (2006.01)
  *H10N 30/084*  (2023.01)
  *H10N 30/85*   (2023.01)

(58) Field of Classification Search
  CPC ............ C01B 2204/24; C01B 2204/26; C01B 2204/28; C01B 2204/30; C01B 2204/32; C01B 32/20; C01B 32/205; C01B 32/21; C01B 32/215; C01B 32/22; C01B 32/225; C01B 32/23; G01L 1/183; G01L 1/162; G01L 1/142; G01L 1/146; G01L 1/2287; G01L 1/22; H10N 30/084; H10N 30/85; H10N 30/302; Y02E 60/10; H01M 4/133; H01M 4/587
  See application file for complete search history.

(56) References Cited

OTHER PUBLICATIONS

Polyethylene Terephthalate, accessed online at: https://www.sciencedirect.com/topics/materials-science/polyethylene-terephthalate (Year: 2024).*

International Search Report issued in corresponding International application No. PCT/CN2020/078909, mailed Nov. 27, 2020.

Written Opinion of the International Searching Authority for No. PCT/CN2020/078909.

Jiang, Yan Qiu etc. "Direct 3D printing of Ultralight Graphene Oxide Aerogel Microlattics" Advanced Functional Materials, vol. 28, Feb. 19, 2018 (Feb. 19, 2018). ISSN:1616-301X.

* cited by examiner

MINIATURE GRAPHENE AEROGEL DEVICE AND PREPARATION METHOD THEREOF

TECHNICAL FIELD

The present disclosure relates to the technical field of functional materials, and particularly to a miniature graphene aerogel device, and a preparation method and use thereof.

BACKGROUND

With the advancement of science and technology, the devices tend to be flexible and miniaturized. At present, miniaturized devices are mainly manufactured by sophisticated silicon-based CMOS processes. However, due to the limited performances, the performances are difficult to be combined in many complex environments. Therefore, there is an urgent need to develop a new material and process to address this problem. Graphene is a nano-carbon material constructed from a single-layer of sp2 hybridized carbon atoms, and its conduction band and a valence band are intersected at the Dirac point. As a result, graphene own with an ultra-fast carrier transport, extremely high electrical conductivity, thermal conductivity and mechanical properties, thus being the most promising material for solving the problem associated with miniaturized devices. However, due to the strong van der Waals force between graphene sheets, the properties of monolayer graphene are difficult to be maintained in the macroscopically assembled materials, which limits its application.

Graphene aerogel is a three-dimensional porous network structure which constructed by single-layer or few-layers graphene walls and air cavities, whereby the interlayer force is weakened by the air gaps, and the intrinsic properties of graphene can be utilized. Therefore, graphene aerogel has aroused great interest for applications. When the nanometer-thick graphene in a material receives a weak external stimulus, such as force, electricity, heat, and sound, etc., the overall signal emitted from the material is disturbed, by which the detection of many stimuli can be realized. In addition, due to the existence of the porous structure in graphene aerogel, more transport channels are provided for the charges, so graphene aerogel also plays an important role in the field of energy storage. However, graphene aerogel is currently mainly prepared by the freezing template method, which is difficult to avoid the existence of defects in ice crystals during the freezing process, causing greatly deteriorated performances. Moreover, the subsequent complex template removal also makes the miniaturization, integration and large-scale production of graphene aerogels is difficult.

Information disclosed in the background section is merely for the purpose of facilitating the understanding of the general background of the present disclosure and is not necessarily to be taken as an acknowledgment or any form of suggestion that the information constitutes prior art that is already known to those of ordinary skill in the art.

SUMMARY

An object of the present disclosure is to provide a method for preparing a miniature graphene aerogel device, by obtaining a miniature graphene aerogel unit on a substrate of a device mainly by in-situ hydroplastic foaming. The method mainly includes dripping graphene oxide in solution onto the surface of the device, and then undergoing in-situ foaming on the surface of the device, which ensured with the high accuracy of the aerogel device.

The dripping can be realized by 3D printing. 3D printing has extremely high accuracy, the resulting aerogel array can be miniaturized, and the stability of the resulting aerogel is excellent. Accordingly, a graphene aerogel array sensor with higher resolution is obtained.

Another object of the present disclosure is to provide a method for preparing a miniature graphene aerogel device, mainly by solvent plasticization and in-situ foaming in combination. This method differs from the existing thermoplastic foaming in that a plasticizer penetrates into a film material in a solution environment to decrease the intermolecular force and reduce the critical threshold of bubble generation. This solves the foaming problem of non-thermoplastic materials and improves the stability of the aerogel device.

In order to achieve any of the above-mentioned objects, the following solution is adopted in this application, which includes printing on a substrate of a device with a graphene oxide solution as an ink, solidifying, dripping a polar solution containing a foaming agent to plasticize and foam the graphene oxide, drying and reducing to obtain a miniature graphene aerogel unit on the substrate of the device.

Alternatively, an equivalent technical solution is adopted, which includes:

printing on a substrate of a device with a graphene oxide solution containing a foaming agent as an ink, solidifying, dripping a polar solution to plasticize and foam the graphene oxide, drying and reducing to obtain a miniature graphene aerogel unit on the substrate of the device.

The foaming agent includes a self-foaming agent and a reactive foaming agent. The reactive foaming agent is a foaming agent that can react with an oxygen-containing functional group of graphene oxide to produce a gas, including but not limited to, hydrazine hydrate, and a borohydride. The self-foaming agent is a foaming agent that can decompose to produce a gas, including but not limited to, a bicarbonate.

As a common knowledge in the art, methods for initiating the foaming of the self-foaming agent include, but are not limited to: use of an initiator and heating, wherein the initiator initiates the foaming agent precursor to produce a gas.

The polar solution includes water, an organic solvent, or a mixed solution of water and an organic solvent. The organic solvent is selected from: dimethylformamide, dimethylacetamide, isopropanol, ethanol and the like. The polar molecule in the polar solution can reduce the intermolecular force between graphene sheets.

The solvent in the graphene oxide solution may be water, dimethylformamide, dimethylacetamide, ethanol, or dimethylsulfoxide.

In the above method, the drying can be achieved through any method, for example, direct drying, solvent-replacement drying and the like.

In some embodiments, before printing the graphene oxide, a circuit is printed on the substrate of the device to ensure that the circuit lead underlies the printed graphene functional unit, which contributes to the stability of the device. Of course, the method described in the present application may also include printing the graphene oxide ink first, and then further printing the circuit.

Another object of the present disclosure is to provide a miniature graphene aerogel device, which has extremely high accuracy and can be used for a high-accuracy sensitive unit in a miniature device.

Another object of the present disclosure is to provide a miniature graphene aerogel device, which is suitable for use in the area where miniature devices capable of long-term stable service are required.

To achieve any of the above objects, the following technical solution is adopted in the present application. A miniature graphene aerogel device includes multiple miniature graphene aerogel units in an array, wherein the miniature graphene aerogel unit can be foamed by in-situ foaming and solvent plasticization in combination.

The circuit in the device can be designed and processed at will as desired, which can be a known technology in the art.

The device can form a sensor, wherein the miniature graphene aerogel unit is used for data acquisition. The miniature graphene aerogel unit prepared by in-situ foaming and solvent plasticization in combination has a high responsiveness to mechanical signals, displacement signals, and acoustic vibration signals. A high-sensitivity and high-accuracy sensor control system can be obtained by forming an array of miniature graphene aerogel units, combined with deep machine learning. The deep machine learning can be achieved through any existing programs that can realize data processing, calculation, presentation, and recognition.

The device can form a planar energy storage device. The miniature graphene aerogel unit prepared by in-situ foaming and solvent plasticization in combination has a structure in layer-by-layer orientation. Therefore, a miniature capacitor constructed with the miniature graphene aerogel unit has a fast ion transmission ability, so the obtained energy storage device has excellent rate performance.

The device can form an energy storage device. The miniature graphene aerogel unit prepared by in-situ foaming and solvent plasticization in combination has a porous structure. Therefore, a miniature battery constructed with the miniature graphene aerogel unit has a high cycle stability.

In the above-mentioned sensors and energy storage devices, circuit design may use a mature technical means in the art.

The present disclosure has the following beneficial effects. In the present disclosure, a miniature graphene aerogel unit is prepared by combining in-situ printing and solution plasticization and foaming, which has excellent flexibility and stability, and is suitable for use in a variety of scenarios, such as sensors, and energy storage devices, etc.

The miniature mentioned in this application is not intended to limit the size, but means that the device size can be made smaller and the device accuracy can be made higher through the present disclosure. The present disclosure is also suitable for the preparation of a large device, but the preparation of the large device is not the main purpose of the present disclosure.

The present disclosure further has the following beneficial effects. The array sensor provided in the present disclosure has extremely high stability, and high accuracy and reliability. Combined with deep machine learning, it can be endowed with the function of learning and recognition of machine intelligence, thus greatly promoting the development of the next generation of artificial intelligence.

DESCRIPTION OF THE EMBODIMENTS

The present disclosure will be further described below with reference to embodiments. However, the protection scope of the present disclosure is not limited thereto.

Example 1

A 20 mg/ml graphene oxide aqueous suspension as an ink was printed on a polyimide substrate by 3D printing, with a droplet diameter being about 20 μm. After solidification, 0.1 ml of an aqueous solution containing 50% hydrazine hydrate was dripped, to plasticize and foam the graphene oxide. After 5 min, the foamed graphene oxide was dried, and subjected to in-situ reduction with hydroiodic acid to obtain a miniature graphene aerogel unit.

Figure 18:
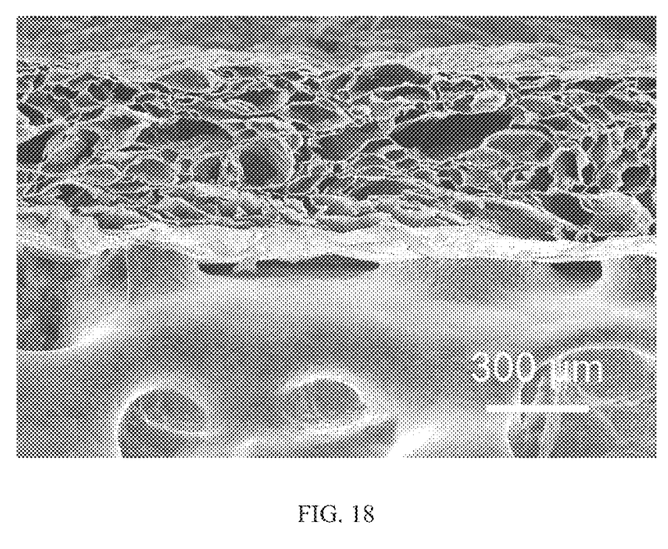
FIG. 18 is a cross-sectional view of a graphene aerogel device prepared in Example 1.

The cross section of the polyimide substrate was observed. As shown in FIG. 18, it can be seen that a graphene aerogel is formed on the polyimide substrate, and the graphene sheets are overlapped on each other to form a porous structure, with a porosity comparable to that of a conventional foamed graphene aerogel. It is expected that this graphene aerogel possesses the mechanical properties, electrical properties, and electromechanical properties, etc. of macroscopic aerogels prepared by a conventional method.

In addition, the graphene aerogel is well connected with the polyimide substrate, which can effectively guarantee the stability of the device.

Example 2

A 10 mg/ml suspension of graphene oxide in DMF was added with an equal weight of sodium bicarbonate and mixed uniformly (where the weight ratio of the graphene oxide solution to sodium bicarbonate was 1:1) to obtain a graphene oxide ink for 3D printing.

The graphene oxide ink was printed on a transparent PET substrate by 3D printing, with a droplet diameter being about 20 μm. After drying and solidification, the product was placed in water, heated at 40° C. to generate bubbles, then dried after 1 min, and subjected to in-situ reduction with hydroiodic acid to obtain a miniature graphene aerogel unit.

Figure 19:
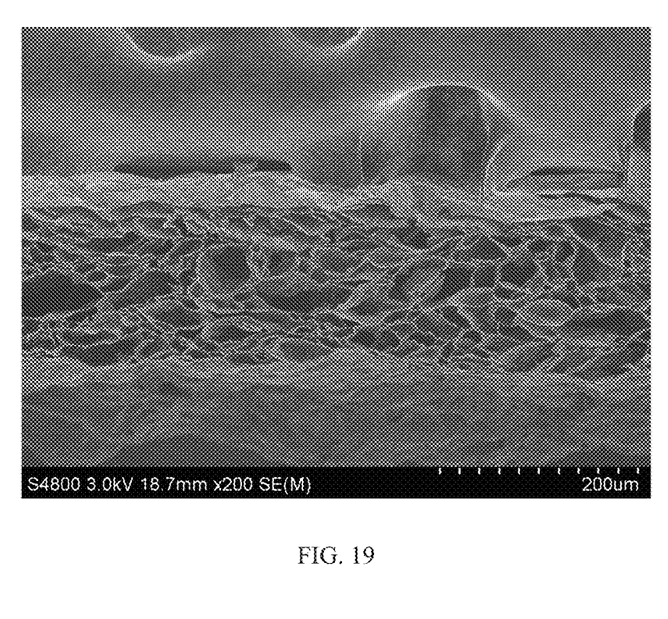
FIG. 19 is a cross-sectional view of a graphene aerogel device prepared in Example 2.

The cross section of the PET substrate was scanned. As shown in FIG. 19, it can be seen that a graphene aerogel is formed on the PET substrate, and the graphene sheets are overlapped on each other to form a porous structure, with a porosity comparable to that of a conventional foamed graphene aerogel. It is expected that this graphene aerogel possesses the mechanical properties, electrical properties, and electromechanical properties, etc. of macroscopic aerogels prepared by a conventional method.

In addition, the graphene aerogel is well connected with the PET substrate, which can effectively guarantee the stability of the device.

Example 3

Figure 1:
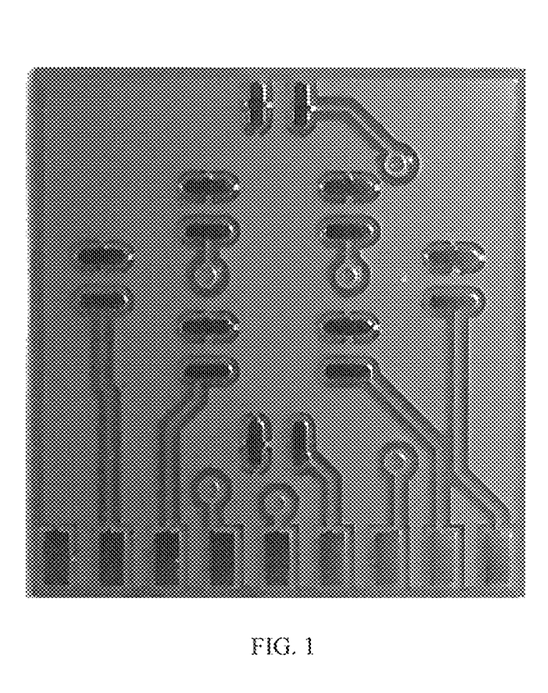
FIG. 1 is a schematic view of an 8-electrode array sensor prepared in Example 3.

A sensor circuit of 8 pairs of electrodes as shown in FIG. 1 was printed on a polyimide substrate (0.8×1.0 $mm^2$) by screen printing. The size of a single electrode is 50×100 $μm^2$, and each pair of electrodes constitutes a test unit. In addition, 8 extraction electrodes and 1 common electrode were set at the bottom. Then, a graphene oxide ink was printed on the test unit in the circuit by 3D printing, in which the graphene oxide ink is a 20 mg/ml aqueous suspension. After drying and solidification, 0.1 ml of an aqueous solution containing 50% hydrazine hydrate was dripped (also by 3D printing, the same below), to foam the graphene oxide in situ. After 5 min, the foamed graphene oxide was dried, and subjected to in-situ reduction with hydroiodic acid to obtain a stable array sensor. An individual miniature graphene aerogel unit has a size within 150×150 $μm^2$, and is covered on a corresponding pair of electrodes.

Figure 2:
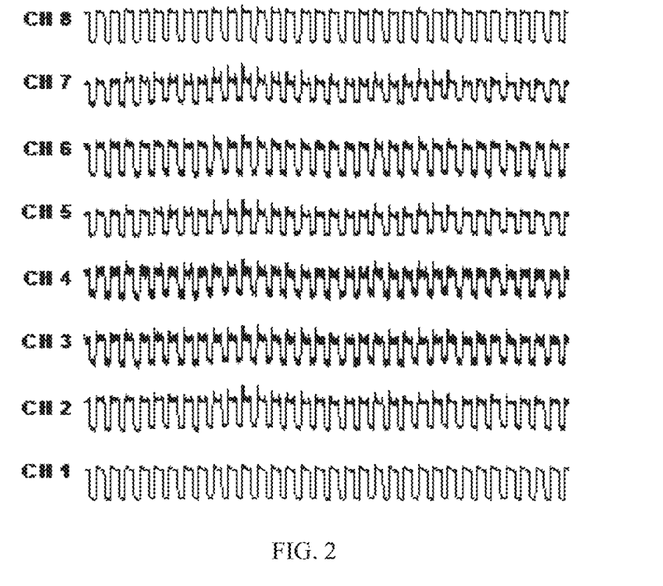
FIG. 2 is a schematic view showing the data acquired by the 8-electrode array sensor prepared in Example 3.

The circuit of the 8-electrode sensor was led to a data acquisition card, the circuit was connected, and a 2V test bias voltage was input to each test unit through the common electrode. A pressure of 0.2 Pa was applied to the 8 test units at the same time. After 8 repeated tests (CH1-CH8), the results show that the current signal is stable and the response time is 100 ms, as shown in FIG. 2.

The pressure was gradually increased to 0.4 Pa, 0.6 Pa, 0.8 Pa, and 1.0 Pa, and then a simulation curve was obtained. Force measurement can be performed based on the simulation curve.

Example 4

Figure 3:
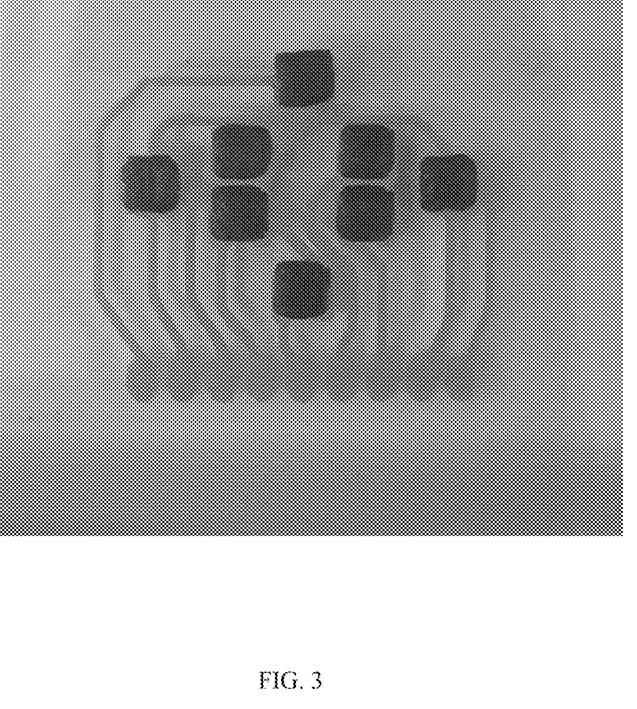
FIG. 3 is a schematic view of an 8-electrode array graphene aerogel sensor prepared in Example 4.

A sensor circuit of 8 pairs of electrodes was printed on a transparent PET substrate (0.8×1.0 $mm^2$) by 3D printing, where the size of a single electrode is 50×100 $μm^2$. In addition, 8 extraction electrodes and 1 common electrode were set at the bottom. Then, a graphene oxide ink was printed on each pair of electrodes in the circuit by 3D printing, in which the graphene oxide ink is a 10 mg/ml suspension in dimethyl formamide. After drying and solidification, 0.1 ml of an aqueous solution containing 0.5% sodium borohydride was dripped, to foam the graphene oxide in situ. After 5 min, the foamed graphene oxide was dried, and subjected to in-situ reduction with hydroiodic acid to obtain a graphene aerogel sensor. Each miniature graphene aerogel unit has a size within 150×150 $um^2$, and is covered on a pair of electrodes, as shown in FIG. 3.

Figure 4:
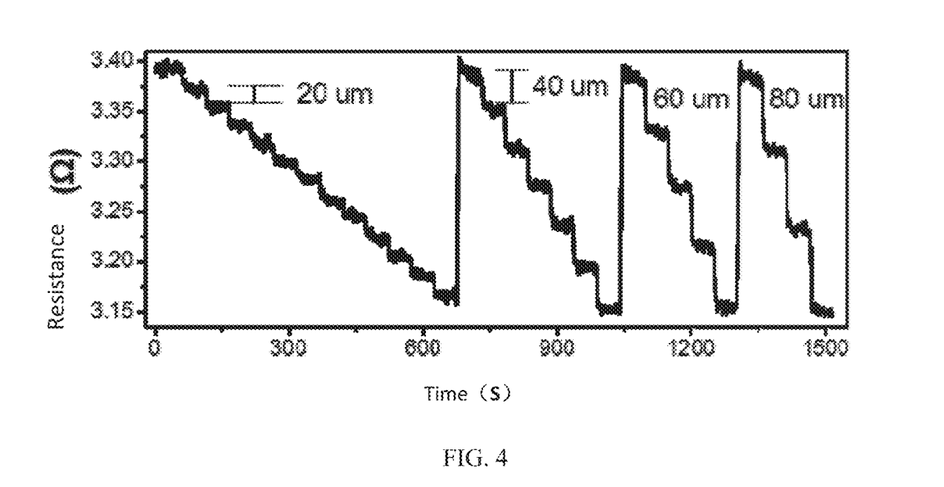
FIG. 4 shows the data change curve of Example 4 with different displacement steps.

The circuit of the 8-electrode sensor was led to an 8-channel data acquisition card, and the circuit was connected by a heat seal connector. A 2V DC voltage was applied, and the graphene aerogel was compressed by an output probe of a stepping motor. The initial current curve was normalized, and then the signals were acquired at different compression levels. The data was fitted, to obtain a fitting curve of the current response value vs the compression level. The fitted data was input into a single-chip microcomputer by a program. When a different electrical signal change is sensed by each sensor, it can be converted into a compression displacement signal in time to detect the displacement change of each sensor, as shown in FIG. 4. An obvious signal change can be observed with continuous progressive displacement of 20 μm, 40 μm, 60 μm and 80 μm.

Example 5

Figure 5:
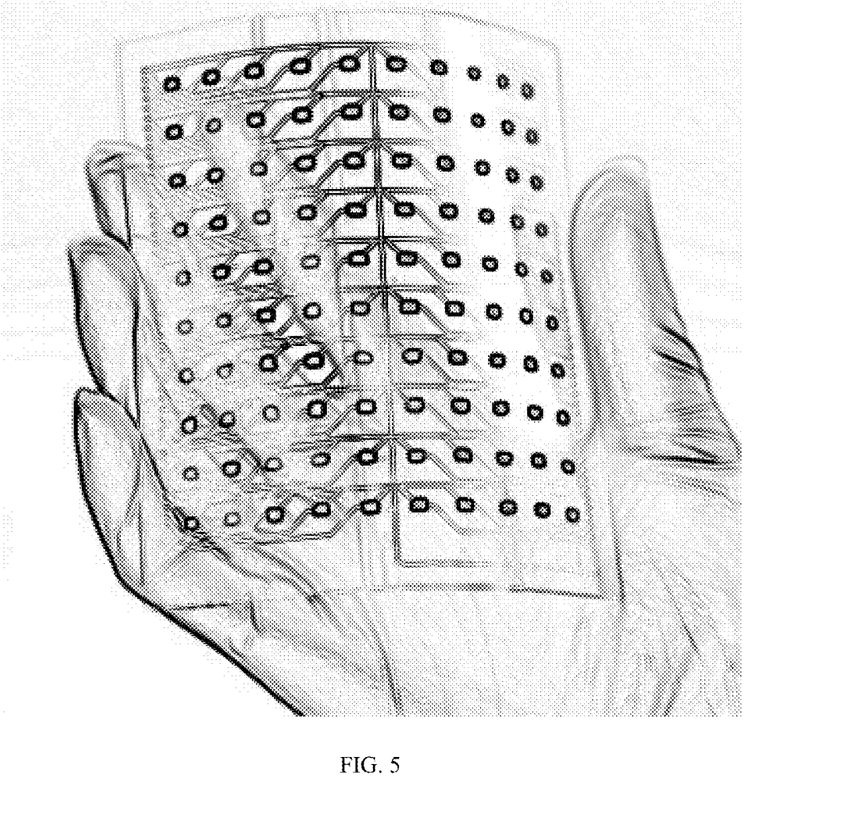
FIG. 5 is a schematic view of a 10*10 array graphene aerogel sensor prepared in Example 5.

A sensor circuit of 10*10 electrodes was printed on a transparent PET substrate by 3D printing, where the size of a single electrode is 1*1 mm. Then, a graphene oxide ink was printed on the sensor component in the circuit by 3D printing, in which the graphene oxide ink is a 10 mg/ml suspension of graphene oxide in dimethyl acetamide. After drying and solidification, 0.2 ml of 2% sodium borohydride solution in ethanol was dripped by 3D printing, to foam the graphene oxide in situ. After 5 min, the foamed graphene oxide was dried, and subjected to in-situ reduction with hydroiodic acid to obtain a stable array sensor. An individual graphene aerogel sensor has a size of 1.5*2 mm, as shown in FIG. 5.

The circuit of the 10*10-electrode sensor was led to an 8-channel data acquisition card, and the circuit was connected by a heat seal connector. A 2V DC voltage was applied. When pressed under various pressures, each sensor was found to have an obvious response signal, it indicates that the prepared sensor can accurately acquire different pressure signals, with a minimum response pressure of 0.32 Pa and a response time of 120 ms.

Example 6

A 10 mg/ml suspension of graphene oxide in DMF was added with an equal weight of sodium bicarbonate and mixed uniformly (where the weight ratio of the graphene oxide solution to sodium bicarbonate was 1:1) to obtain a graphene oxide ink for 3D printing.

A sensor circuit of 8 electrodes was printed on a transparent PET substrate by 3D printing, where the size of a single electrode is 1*2 mm. Then, a graphene oxide ink was printed on the sensor component in the circuit by 3D printing. After drying and solidification, the sensor circuit was placed in water, and heated at 40° C. to generate bubbles. After 1 min, the foamed graphene oxide was dried, and subjected to in-situ reduction with hydroiodic acid to obtain a stable array sensor. An individual graphene aerogel sensor has a size of 2*4 $mm^2$.

Figure 6:
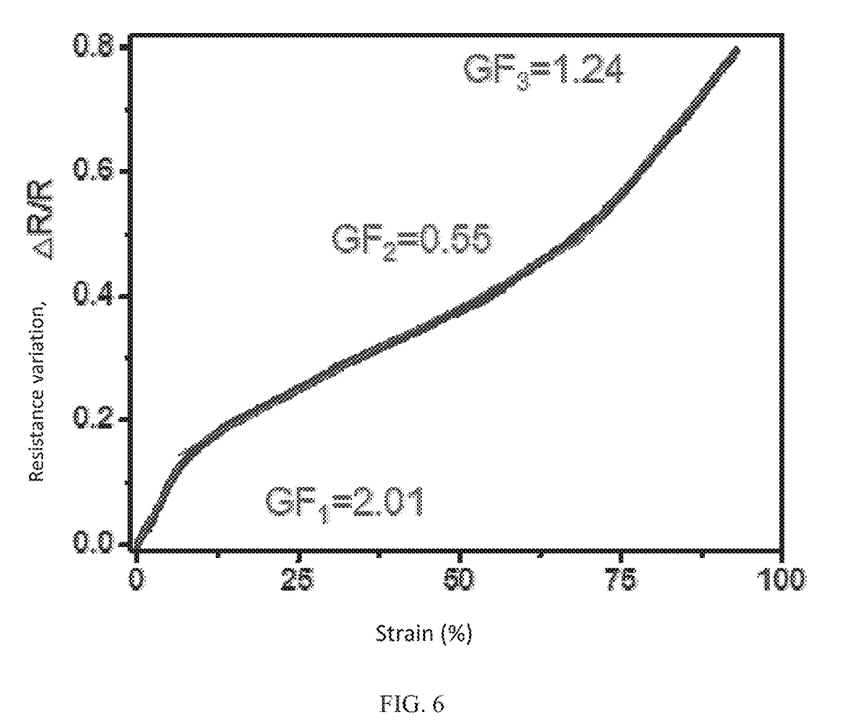
FIG. 6 shows a displacement calibration fitting curve of a sensor prepared in Example 6.

The circuit of the 8-electrode sensor was led to a data acquisition card, and the circuit was connected by a heat seal connector. A 2V DC voltage was applied, and the graphene aerogel was pressed by an object. The initial current curve was normalized, and then the signals were acquired at different displacements. The data was fitted, to obtain a fitting curve of the current response value vs the displacement of the object, as shown in FIG. 6. The gauge factor (GF) can reach 2. The fitted data was input into a single-chip microcomputer by a program. When a different electrical signal change is sensed by each sensor, it can be converted into a displacement signal in time to detect the displacement change of each object.

Example 7

Figure 7:
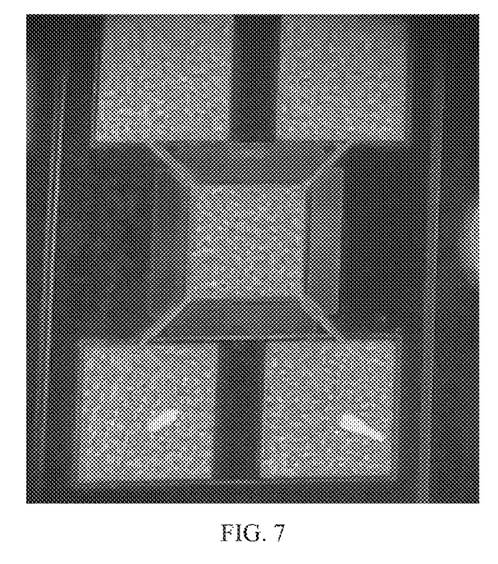
FIG. 7 is a schematic view of an aluminum nitride piezoelectric resonant sensor used in Example 7.

A commercial aluminum nitride piezoelectric resonant sensor as shown in FIG. 7 was used. A graphene oxide ink was printed on a vibration component of 200*200 um by 3D printing, in which the graphene oxide ink is a 100 mg/ml suspension of graphene oxide in ethanol. After drying and solidification, 0.3 ml of a 20% hydrazine hydrate solution in dimethyl formamide was dripped by 3D printing, to foam the graphene oxide in situ. After 5 min, the foamed graphene oxide was dried, and subjected to in-situ reduction with hydroiodic acid to obtain a stable array sensor. An individual graphene aerogel sensor has a size of 300*300 um².

The sensor can be prepared into a passive acoustic wave detection system. When an acoustic wave of a certain frequency appears (within the bandwidth of the piezoelectric resonator, generally below 1 MHz), the piezoelectric film periodically vibrates (with an amplitude of hundreds of nanometers). Due to the positive piezoelectric effect, the periodic strain produces an induced current (at microampere level) of corresponding frequency, and the change in the electrical characteristics of the graphene aerogel on the resonator amplifies the electrical signal (ten-microampere level). The induced current is acquired on the upper and lower electrodes respectively and connected to the circuit board by wire bonding. The signal can be detected by a power amplifier circuit and a filter circuit (where it is amplified to milliampere level). According to the frequency and amplitude information of the signal, information such as the frequency and intensity of the acoustic wave can be extracted.

Example 8

A commercial aluminum nitride piezoelectric resonant sensor was used. A graphene oxide ink was printed on a vibration component by 3D printing, in which the graphene oxide ink is a 100 mg/ml suspension of graphene oxide in dimethyl acetamide. After drying and solidification, 0.3 ml of a 20 mg/ml dimethyl acetamide/water (1:1 wt/wt) solution was dripped by 3D printing, to foam the graphene oxide in situ. After 5 min, the foamed graphene oxide was dried, and subjected to in-situ reduction with hydroiodic acid to obtain a stable array sensor. An individual graphene aerogel unit has a size of 500*500 um².

The sensors can be prepared into a mechanical and displacement detection system. The piezoelectric device can vibrate periodically (with an amplitude of hundreds of nanometers). When a very small mechanical or strain signal appears, the electrical signal of the aerogel changes and the signal transmitted through the vibration component is amplified by 10 to 100 times, resulting in an extremely high detection accuracy. The minimum detection pressure is 0.001 Pa, and the minimum detection displacement is 0.01%.

Example 9

Figure 8:
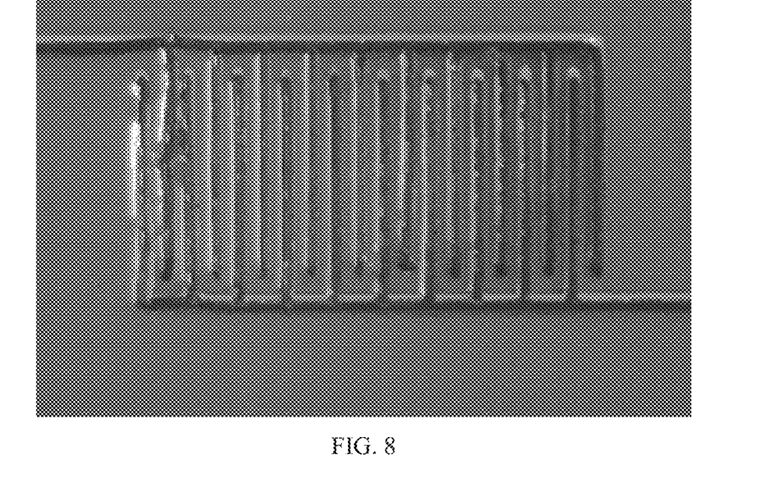
FIG. 8 is a schematic view of an interdigital miniature graphene aerogel capacitor prepared in Example 9.

As shown in FIG. 8, an interdigital silver circuit of 10*10 electrodes was printed as a current collector on a transparent PET substrate by 3D printing, where the size of a single electrode is 20*1 mm. Then, a graphene oxide ink was printed on the electrode component in the circuit by 3D printing, in which the graphene oxide ink is a 15 mg/ml suspension of graphene oxide in DMF. After drying and solidification, 0.2 ml of 4% sodium borohydride solution in dimethyl acetamide/isopropanol was dripped by 3D printing, to foam the graphene oxide in situ. After 5 min, the foamed graphene oxide was dried, and subjected to in-situ reduction with hydroiodic acid to obtain a stable miniature array capacitor. An individual graphene aerogel unit has a size of 20*1 mm².

Figure 9:
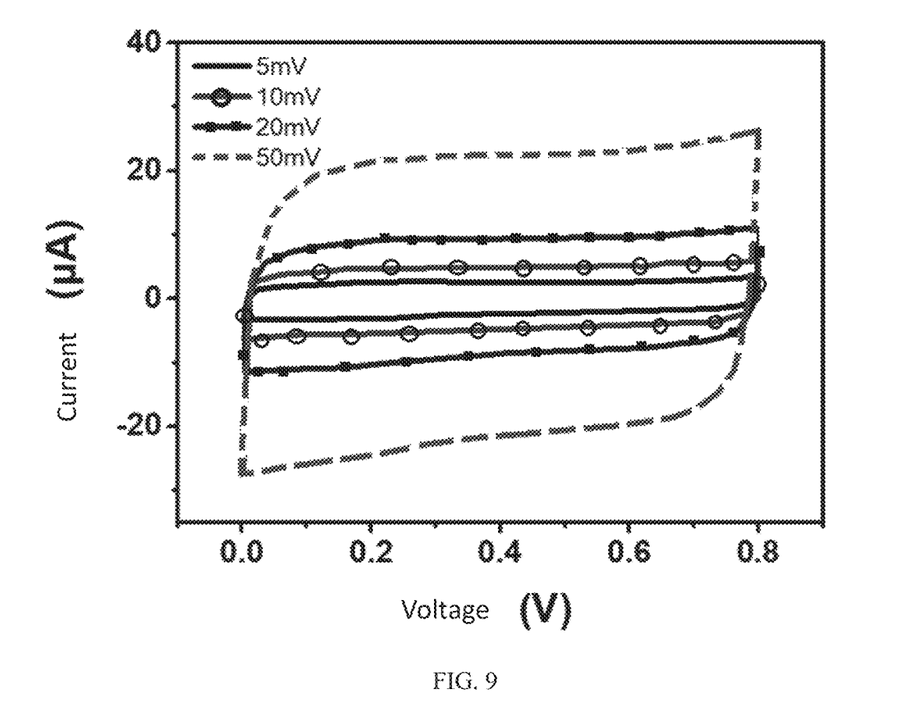
FIG. 9 shows a cyclic voltammetry curve of the capacitor prepared in Example 9 at a constant scanning speed.
Figure 10:
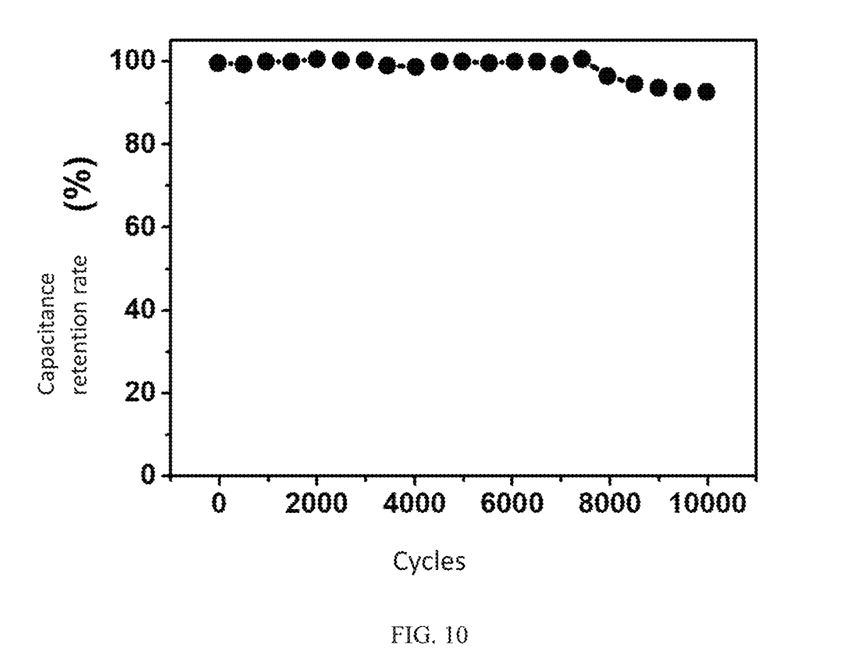
FIG. 10 shows a cycle performance curve of the capacitor prepared in Example 9.

10 interdigital capacitors as described above were printed, and then connected in series; and two terminal electrodes were led to an electrochemical workstation. When the capacitors were tested by cyclic voltammetry at different scanning speeds, they were found to have obvious capacitance storage capacity, and have a large instantaneous output voltage that is up to 10 V, as shown in FIG. 9. The capacitors can be stably cycled for 10,000 times without any significant drop in capacitance, as shown in FIG. 10. This proves that such miniature array supercapacitors have extremely huge potential applications in the field of microelectronics in the future.

Example 10

Figure 11:
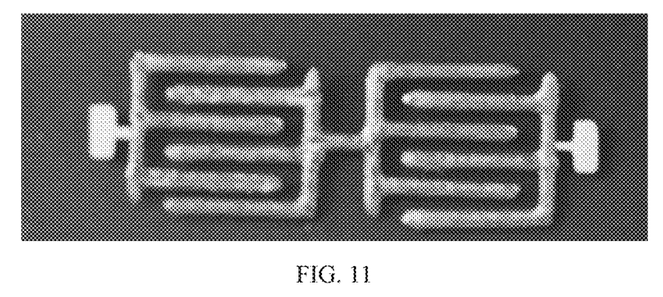
FIG. 11 is a schematic view of a lithium ion-graphene aerogel miniature battery prepared in Example 10.
Figure 12:
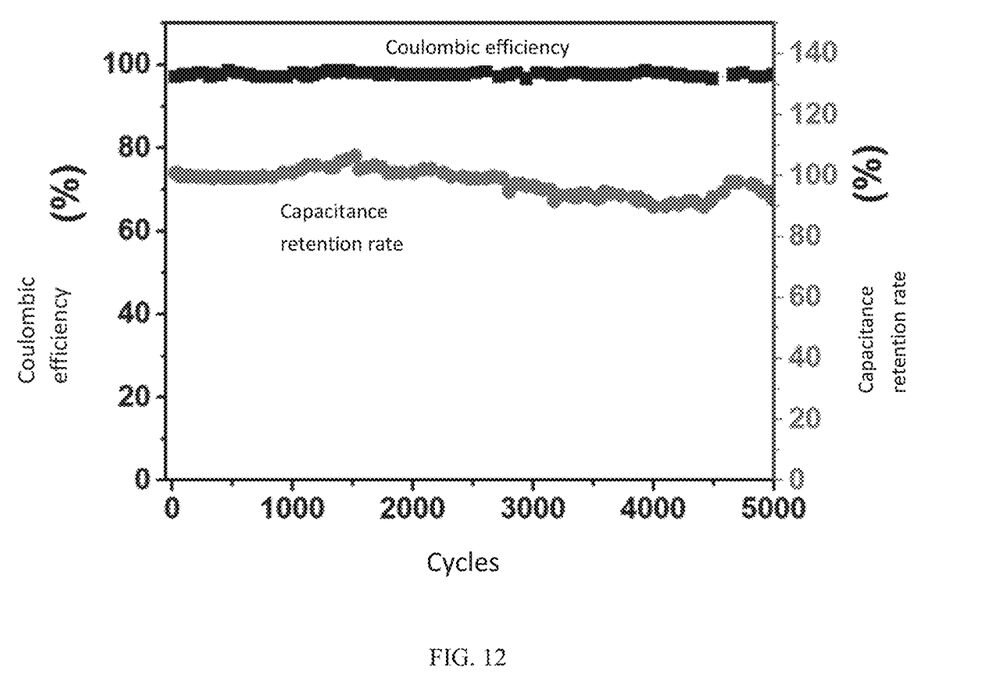
FIG. 12 shows the capacitance and coulombic efficiency retention rate of the battery prepared in Example 10 during a long-term cycle process.

An interdigital silver circuit of two pairs of 3*3 electrodes was printed and connected in parallel as a current acquireor on a transparent PET substrate by 3D printing. Commercial carbon-coated $Li_4Ti_5O_{12}$ particles were printed on one end of the interdigital electrode and used as an anode material. A 60 mg/ml suspension of graphene oxide in dimethyl sulfoxide was printed on the cathode. After drying, 0.1 ml of a 25% hydrazine hydrate solution in isopropanol was dripped by 3D printing, to foam the graphene oxide in situ. After 5 min, the foamed graphene oxide was dried, and subjected to in-situ reduction with hydroiodic acid to obtain a stable lithium-ion array battery as shown in FIG. 11. The battery has an ultra-high energy density of up to 59.8 mWh·cm$^{-3}$, in which the porous aerogel structure can greatly increase the carrier transport of the electrolyte and enhance the charging and discharging speed. After 5000 cycles of charge and discharge, the capacitance and coulombic efficiency are kept basically unchanged, as shown in FIG. 12. The rate performance of the prepared miniature battery is good.

Application Example 1

Figure 13:
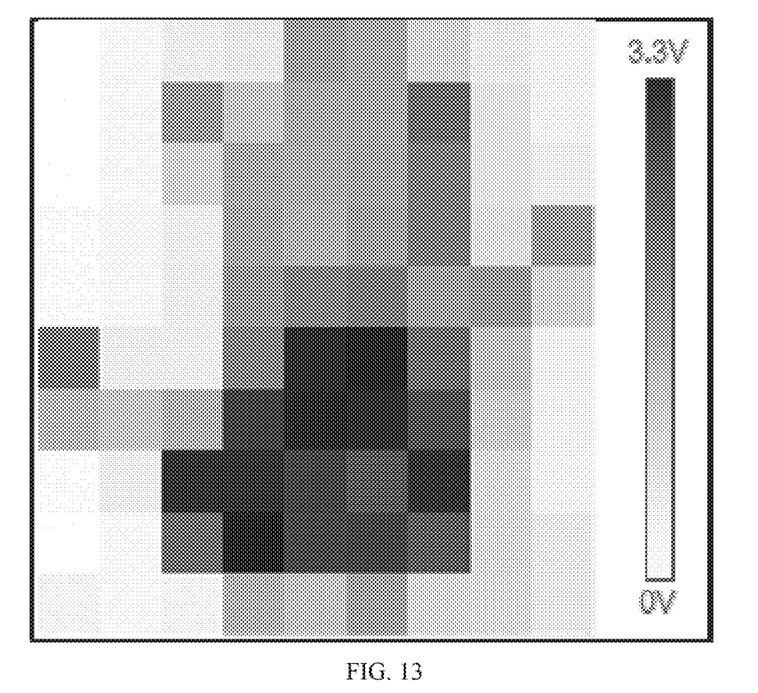
FIG. 13 is a view showing the recognition of a palm shape by a 10*10 electrode in an application example.

The preparation of the electrode was as described for the 10*10 aerogel array shown in Example 5. The electrode was connected to two 64-channel data acquisition cards to acquire signals in 100 channel at the same time. When a palm was lowered and pressed on the aerogel array, an obvious hand shape can be observed after data processing, as shown in FIG. 13.

Application Example 2

Figure 14:
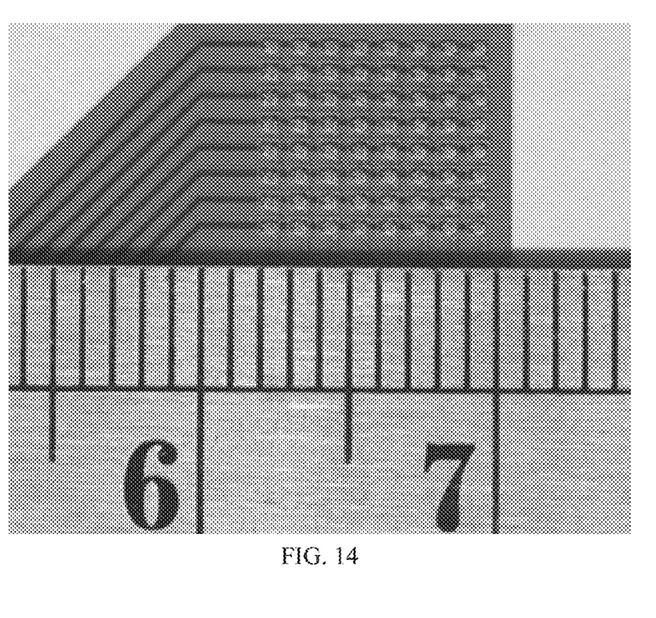
FIG. 14 is a schematic view of a highly integrated 8*8 finger array graphene aerogel sensor.

A sensor circuit of 8*8 electrodes was printed on a polyimide substrate by the FCT process, where the size of a single aerogel electrode is 300*400 um. Then, a graphene oxide ink was printed on the sensor component in the circuit by 3D printing, in which the graphene oxide ink is a 20 mg/ml aqueous suspension. After drying and solidification, 0.1 ml of 50% aqueous hydrazine hydrate solution was dripped, to foam the graphene oxide in situ. After 5 min, the foamed graphene oxide was dried, and subjected to in-situ reduction with hydroiodic acid to obtain a stable array sensor, as shown in FIG. 14.

Figure 15:
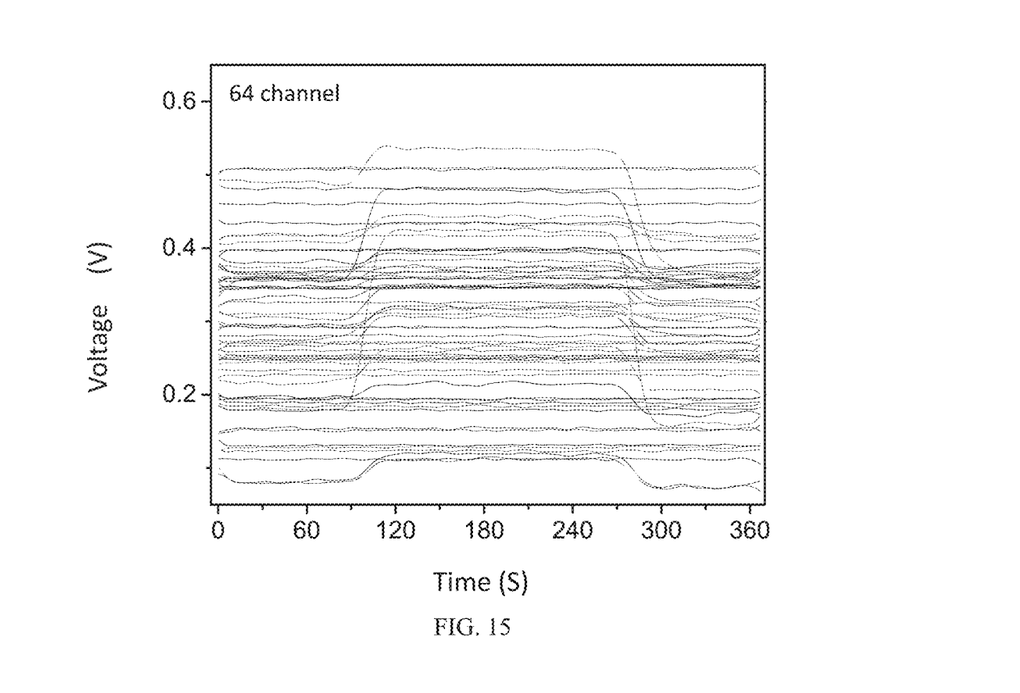
FIG. 15 shows a data acquisition curve of each channel of an 8*8 sensor.
Figure 16:
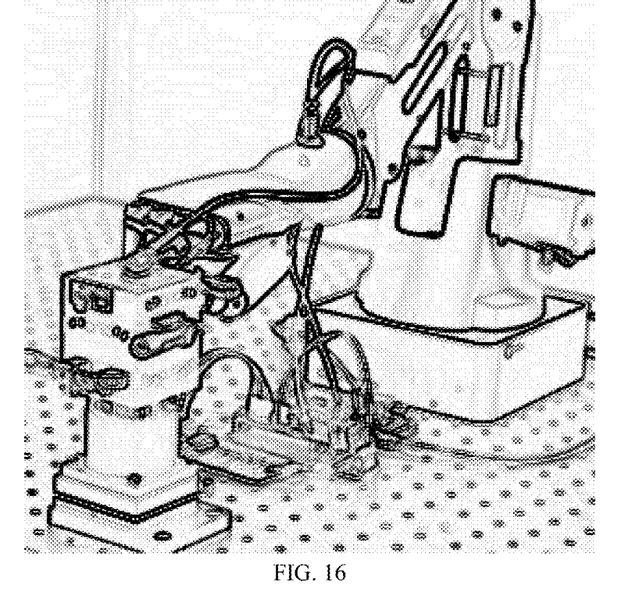
FIG. 16 is a schematic view of an 8*8 array sensor integrated in a manipulator and controlled by the manipulator.
Figure 17:
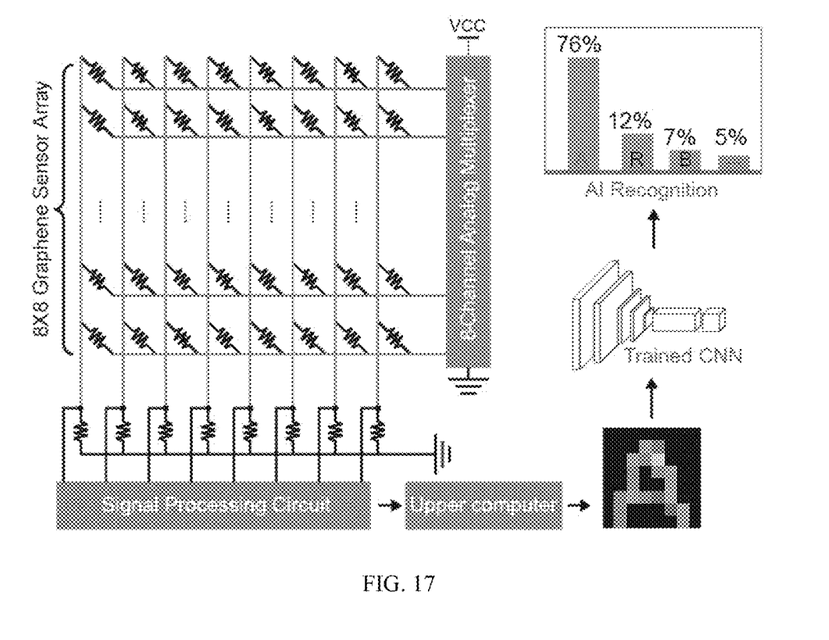
FIG. 17 is a schematic view showing a circuit capable of letter recognition by using deep machine learning and a graphene aerogel array sensor, and an underlying principle thereof.

The circuit of the 8*8 electrode sensor was led to a single-chip microcomputer, and the circuit was connected by a wire. Data was acquired by wheel reading. As shown in FIG. 15, all the sensors are confirmed to have obvious response signals. The prepared sensor was fixed on a finger of a dexterous robot hand, and driven to move by a manipulator to press 26 letters respectively, as shown in FIG. 16. The obtained data was input into a convolutional neural network for deep learning. A trained neural network was obtained. Then, different letters are selected at will and pressed by the dexterous robot hand, by which the unknown letters can be recognized quickly within 1 s. The recognition accuracy can reach 100%, which is much higher than the recognition rate of human fingers (about 30%). The specific machine learning is schematically shown in FIG. 17.

What is claimed is:

1. A method for preparing a miniature graphene aerogel device having a miniature graphene aerogel unit, the method comprising:
   printing on a substrate of a device with a graphene oxide solution as an ink;
   dripping a polar solution containing a foaming agent after solidifying to plasticize and foam the graphene oxide; and
   drying and reducing to obtain a miniature graphene aerogel unit on the substrate of the device,
   wherein the foaming agent comprises a self-foaming agent or a reactive foaming agent, wherein the reactive foaming agent is a foaming agent that reacts with an oxygen-containing functional group of graphene oxide to produce a gas, and the self-foaming agent is a foaming agent that decomposes to produce a gas; and
   wherein the reactive foaming agent comprises a borohydride; and the self-foaming agent comprises a bicarbonate.

2. The preparation method according to claim 1, wherein the polar solution comprises water, an organic solvent, or a mixed solution of water and an organic solvent.

3. The preparation method according to claim 2, wherein the organic solvent is selected from: dimethylformamide, dimethylacetamide, isopropanol, and ethanol.

4. The preparation method according to claim 1, wherein the solvent in the graphene oxide solution is water, dimethyl formamide, dimethyl acetamide, ethanol, or dimethyl sulfoxide.

5. The preparation method according to claim 1, wherein a circuit is printed on the substrate of the device before printing the graphene oxide.

* * * * *